(12) United States Patent
Lu et al.

(10) Patent No.: US 6,407,600 B1
(45) Date of Patent: Jun. 18, 2002

(54) METHOD AND APPARATUS FOR PROVIDING A START-UP CONTROL VOLTAGE

(75) Inventors: Yi Lu; Ian A. Young; Keng L. Wong, all of Portland; Douglas R. Parker, Forest Grove, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/605,552

(22) Filed: Jun. 27, 2000

(51) Int. Cl.[7] .................................................. H03L 7/06
(52) U.S. Cl. ........................................ 327/156; 327/198
(58) Field of Search ................................. 327/156, 198, 327/536

(56) References Cited

U.S. PATENT DOCUMENTS

| | | | | |
|---|---|---|---|---|
| 5,523,724 A | * | 6/1996 | Assar et al. ................. | 331/1 A |
| 5,699,387 A | * | 12/1997 | Seto et al. .................... | 327/157 |
| 5,708,387 A | * | 1/1998 | Cleveland et al. ........... | 327/536 |
| 5,847,614 A | * | 12/1998 | Gilbert et al. ............... | 327/157 |
| 5,942,949 A | * | 8/1999 | Wilson et al. ............... | 327/159 |
| 6,028,473 A | * | 2/2000 | Kamei et al. ................ | 327/536 |
| 6,084,800 A | * | 7/2000 | Choi et al. ............... | 365/185.23 |

* cited by examiner

Primary Examiner—Terry D. Cunningham
(74) Attorney, Agent, or Firm—Blakely, Sokoloff, Taylor & Zafman LLP (57) ABSTRACT

A startup control voltage preset method and apparatus to reduce phase locked loop lock acquisition time at startup. In one embodiment, the disclosed apparatus includes a phase locked loop circuit including a startup circuit that is activated at startup. The startup circuit is coupled to force a control input of a voltage control oscillator of the phase lock loop circuit across a loop filter to a voltage at or near a target nominal operating voltage. In one embodiment, the target nominal operating voltage corresponds to a target operating frequency of the phase locked loop circuit. In one embodiment, the startup circuit is coupled to be activated for a predetermined time at startup. In one embodiment, the startup circuit is coupled to be activated at startup until the control input voltage of the voltage controlled oscillator is at or near a reference voltage.

20 Claims, 8 Drawing Sheets

METHOD AND APPARATUS FOR PROVIDING A START-UP CONTROL VOLTAGE

BACKGROUND OF THE INVENTION

1. Field of the Invention

The present invention relates generally to the field of electronics and, more specifically, the present invention relates to phase locked loop circuitry.

2. Background Information

Phase locked loop circuits are a well-known form of circuit useful in synchronizing a clock signal internal to a circuit with an external clock signal. Present day phase locked loop circuits include circuitry to generate an oscillating signal that is phase locked with a reference clock. The oscillating signal is controlled and maintained in response to a control voltage, which is generated and maintained by circuitry of the phase locked loop circuit. Phase locked loop circuits are useful in a variety of electronic applications including synchronizing circuits in computers, communications, etc.

Continuing efforts are being made to reduce power consumption and/or increase battery life in electronic devices such as computers or the like. For example, many present day notebook computers are provided with a standby mode. While in standby mode, circuitry in the notebook computer, including phase locked loop circuitry, is substantially powered down reduce power consumption. Consequently, when active operations are to be resumed on the notebook computer, the circuitry including the phase locked loop circuitry of the computer is powered back up. There is a latency time in the computer during this startup period when the phase locked loop circuitry is powered back up. During this latency time, normal operations are generally unavailable in the computer since circuitry in the computer may not be synchronized properly. Normal operations in the computer may resume after the phase locked loop circuit stabilizes and the control voltage of the phase locked loop circuit is sufficiently charged such that the oscillating signal or a fraction thereof of the phase locked loop circuit is phase locked with the reference clock signal.

BRIEF DESCRIPTION OF THE DRAWINGS

The present invention is illustrated by way of example and not limitation in the accompanying figures.

DETAILED DESCRIPTION

Methods and apparatuses for providing a startup control voltage for phase locked loop circuit are disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

In an example embodiment, a startup circuit is coupled to charge a control voltage node of a phase locked loop circuit during startup to reduce the amount of time to acquire phase lock in the phase locked loop circuit. In one embodiment, a startup circuit is activated during initialization to force the control voltage of the phase locked loop circuit to start at or near a target nominal operating voltage. In an example embodiment, the target nominal operating voltage is known and defined to correspond to a target operating frequency of the phase locked loop circuit after startup. In one embodiment, the startup circuit is activated and deactivated in response to a startup signal during the startup period of the phase locked loop circuit. After the control voltage node is substantially charged to or near the target nominal operation voltage, the startup circuit is no longer used and a charge pump of the phase locked loop circuit is used to maintain the control voltage of the phase locked loop circuit.

Figure 1:
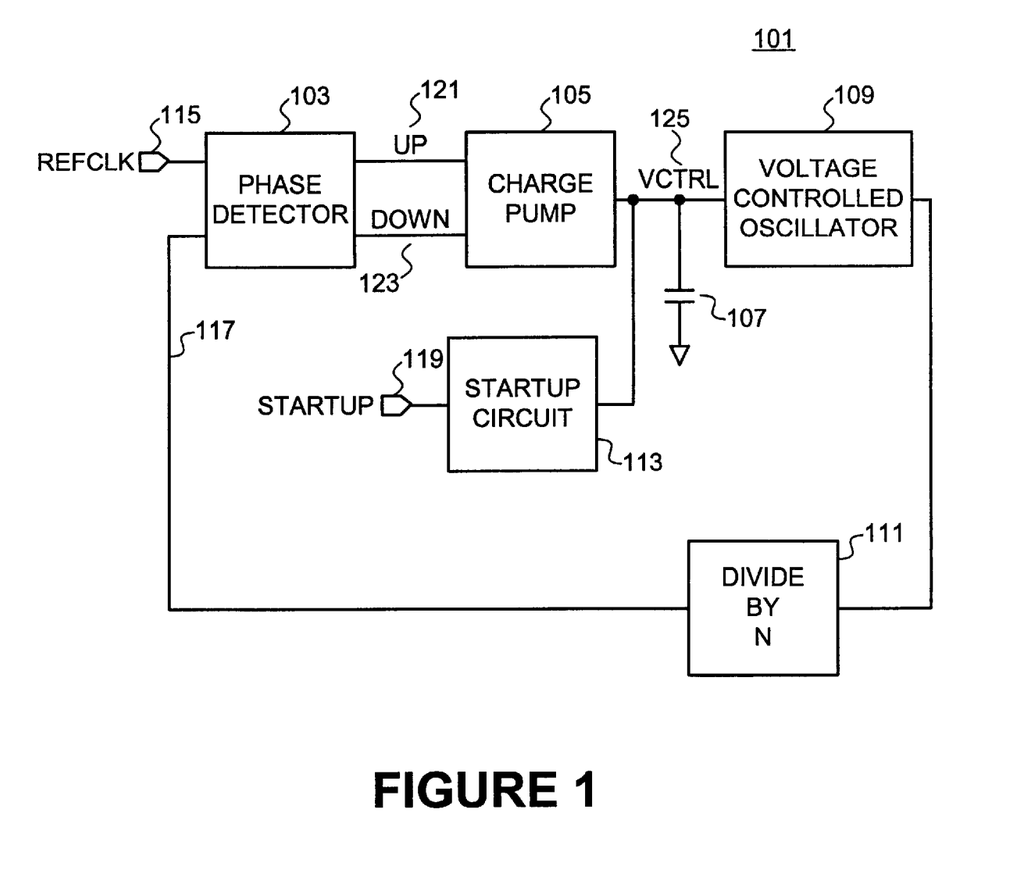
FIG. 1 is a block diagram illustrating one embodiment of a phase locked loop circuit in accordance with the teachings of the present invention.

To illustrate, FIG. 1 is a block diagram showing one embodiment of a phase locked loop circuit 101 in accordance with the teachings of the present invention. As shown, a phase detector 103 is coupled to receive a reference clock signal 115 and a feedback oscillating signal 117. Phase detector 103 measures the phase difference between reference clock signal 115 and oscillating signal 117 and generates up signal 121 and down signal 123 in response. A charge pump 105 is coupled to receive up signal 121 and down signal 123 from phase detector 103. Charge pump 105 includes an output from which charge or current is "pumped" to a loop filter circuit 107. In one embodiment, loop filter circuit 107 includes a capacitor. As charge pump 105 pumps out charge or current in response to the up signal 121 and down signal 123 from phase detector 103, a control voltage VCTRL 125 is generated across the loop filter circuit 107, which is coupled to be received by a control input of voltage controlled oscillator 109.

Voltage controlled oscillator 109 generates an oscillating signal in response to the control voltage VCTRL 125. In one embodiment, the oscillating signal generated by voltage controlled oscillator 109 is coupled to be received by a divide by N circuit 111, which generates the feedback oscillating signal 117 coupled to be received by phase detector 103. In one embodiment, divide by N circuit 111 divides the oscillating signal output from voltage controlled oscillator 109 by 2. It is appreciated of course that in other embodiments, divide by N circuit 111 may divide the oscillating signal output from voltage controlled oscillator 109 by other values such as 1, 3, 4, etc., in accordance with the teachings of the present invention.

In operation, phase locked loop circuit 101 stabilizes or locks onto the phase of reference clock signal REFCLK 115. In one embodiment, the frequency of reference clock signal REFCLK 115 is known and therefore, a nominal operating voltage for VCTRL 125 used to generate an oscillating signal 117 having the same frequency is also known.

In one embodiment, when phase locked loop circuit 101 is powered up from a standby mode or powered down mode, there is a startup period. The startup period begins from the time power is first applied to the time at which the control voltage VCTRL 125 is at or near the nominal operating voltage, at which time phase locked loop circuit 101 is locked. Normal operations in a computer, for example, using phase locked loop circuit 101 are generally not begun or resumed until phase locked loop circuit 101 is locked and the control voltage VCTRL 125 has stabilized at or near the nominal operating voltage. In one embodiment, charge pump 105 is generally tuned to maintain the control voltage VCTRL 125 rather than quickly charge VCTRL 125 to the nominal operating voltage from a powered down condition.

In an example embodiment of the present invention, a startup circuit 113 is included to more quickly charge VCTRL 125 at startup to reduce the lock acquisition time of phase locked loop circuit 101. By reducing the lock acquisition time at startup, response time latency of a computer or other circuit using phase locked loop circuit 101 is reduced. In particular, startup circuit 113 is coupled to an output of charge pump 105 to supplement the charge pump 105 output during the startup period of phase locked loop circuit 101 in response to startup signal 119.

Figure 2:
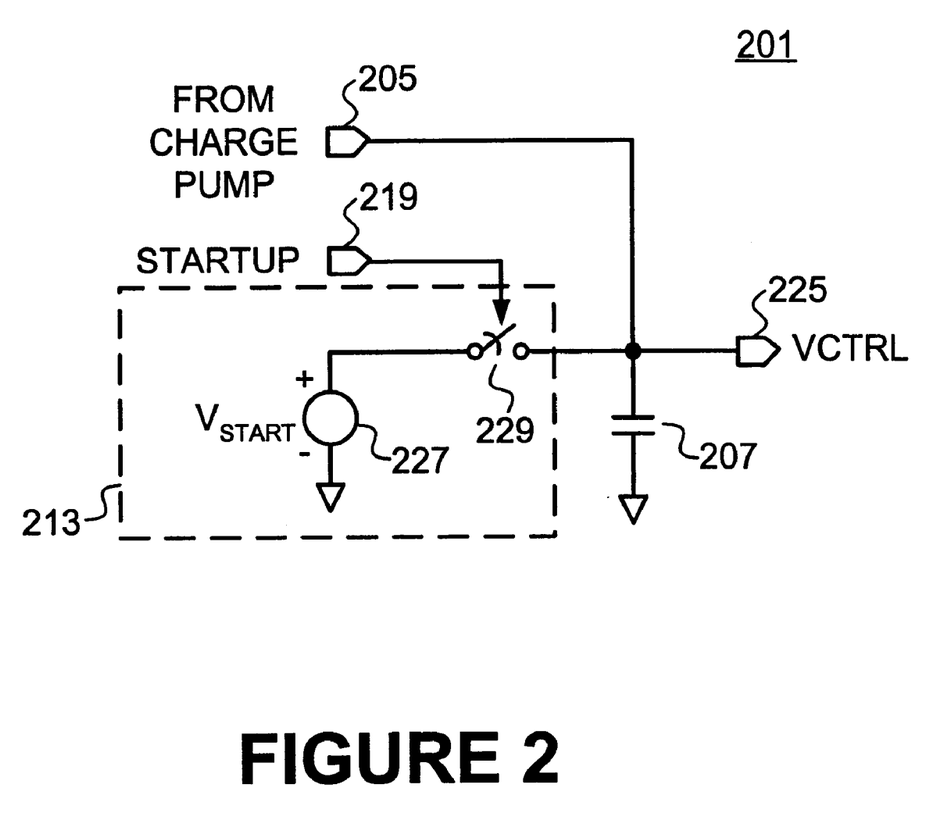
FIG. 2 is a block diagram illustrating one embodiment of a startup circuit coupled to a phase locked loop circuit in accordance with the teachings of the present invention.

FIG. 2 is a schematic illustrating one embodiment of a startup circuit 213 included in one embodiment of a phase locked loop circuit 201 in accordance with the teachings of the present invention. As illustrated, one embodiment of startup 213 includes a voltage source 227 providing a voltage $V_{START}$. In the example embodiment, voltage source 227 is enabled in response to startup signal 219 through switch 229. Therefore, in the illustrated embodiment, startup circuit 213 is digitally responsive to startup signal 219 to provide voltage $V_{START}$ to loop filter 207. As illustrated in the example embodiment, loop filter 207 is also coupled to an output from charge pump 205 and provides a control voltage VCTRL 225, which is coupled to be received by a voltage controlled oscillator (not shown) of phase locked loop circuit 201.

Figure 3:
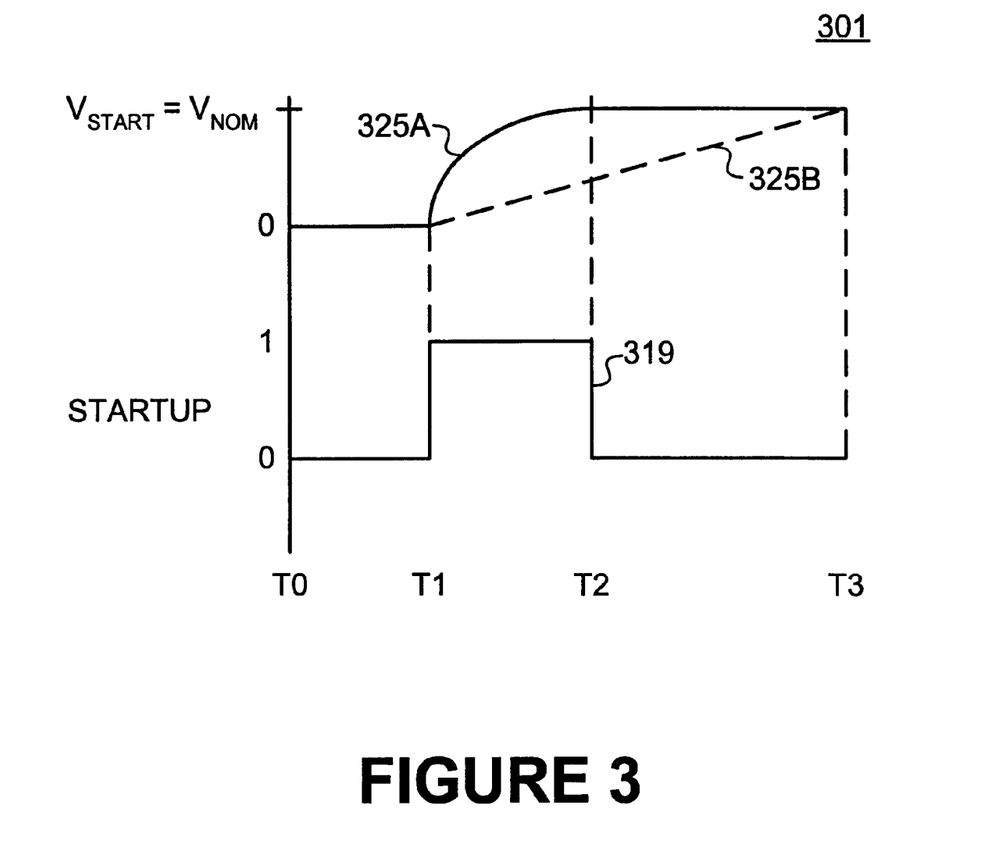
FIG. 3 is a timing diagram illustrating one embodiment of a control voltage and a startup signal of a startup circuit in accordance with the teachings of the present invention

FIG. 3 is one embodiment of a timing diagram 301 illustrating various voltage waveforms or levels of a startup circuit and a phase locked loop circuit in accordance with the teachings of the present invention. As illustrated in FIG. 3, startup signal 319 as well as control voltage VCTRL 325A are zero at time T0. In one embodiment, time T0 corresponds to a time that the phase locked loop circuit is powered down or in standby. Accordingly, since the phase locked loop circuit is powered down and VCTRL 325A is zero, the voltage controlled oscillator of the phase locked loop circuit is not generating an oscillating waveform.

At time T1, startup signal 319 is activated to indicate that the phase locked loop circuit is to begin startup and acquire a lock with the reference clock. As illustrated, control voltage VCTRL 325A begins to asymptotically converge with voltage $V_{START}$ and is at or near $V_{START}$ at time T2. In one embodiment, voltage $V_{START}$ is set to be substantially equal to a nominal operating voltage $V_{NOM}$ for the control input of the voltage controlled oscillator. In one embodiment, $V_{NOM}$ corresponds to a target frequency of operation of the phase locked loop circuit after startup when the phase locked loop circuit has locked.

At time T2, startup signal 319 is deactivated since control voltage VCTRL 325A has reached or asymptotically converged with the voltage $V_{START}$. As a result, the lock acquisition time of the phase locked loop circuit is substantially reduced in accordance with the teaching of the present invention since the phase locked loop circuit is forced to start at or near its target frequency of operation since the control voltage is forced to start at or near its target nominal operating voltage.

For illustration purposes, control voltage VCTRL 325B of FIG. 3 corresponds to the control voltage at the input of the voltage controlled oscillator if a startup circuit was not included in a phase locked loop circuit in accordance with the teaching of the present invention. Without an embodiment of the presently described startup circuit, the control voltage is charged up only using a charge pump circuit and, consequently, control voltage VCTRL 325B rises at a slower rate than control voltage 325A, as shown. As a result, the nominal operating voltage $V_{NOM}$ is not reached at the control input of the voltage control oscillator until time T3. As shown, time T3 occurs later than time T2 and, correspondingly, the phase locked loop circuit has a longer lock acquisition time at startup without an embodiment of the presently described startup circuit. It is appreciated of course that VCTRL 325B is not necessarily a linear signal as illustrated in FIG. 3 for explanation purposes.

Figure 4:
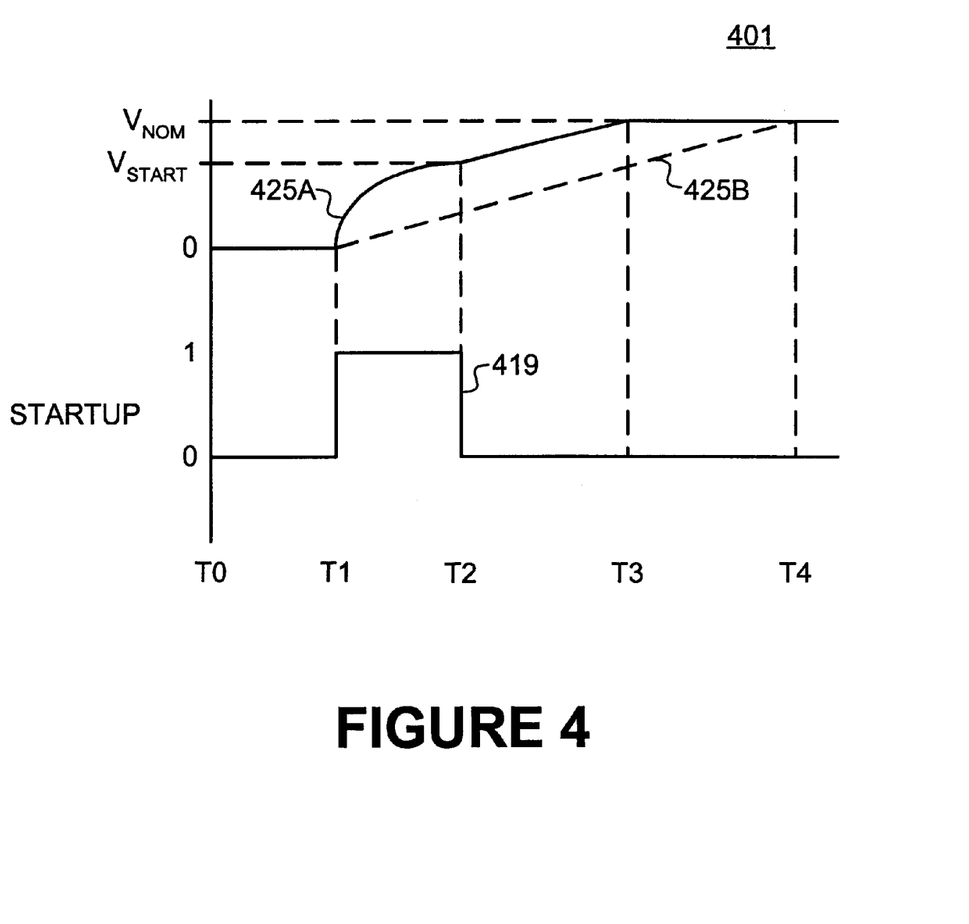
FIG. 4 is a timing diagram illustrating another embodiment of a control voltage and startup signal of a startup circuit in accordance with the teachings of the present invention.

FIG. 4 is an illustration of another embodiment of a timing diagram 401 in accordance with the teachings of the present invention. In the example embodiment illustrated in FIG. 4, the voltage $V_{START}$ of the voltage supply of a startup circuit is preset to a voltage less than the nominal operating voltage of the voltage controlled oscillator of the phase locked loop circuit. In particular, at time T0, the startup signal 419 is deactivated and the control voltage VCTRL 425A is also at zero. At time T1, the startup signal 419 is activated and the startup circuit is correspondingly activated. Therefore, at time T1, control voltage VCTRL 425A begins to asymptotically approach the voltage $V_{START}$. At time T2, the control voltage VCTRL 425A has reached $V_{START}$ and, therefore, startup signal 419 in this embodiment is deactivated. From time T2 to time T3, the control voltage VCTRL 425A continues to rise in response to the charge pump until the phase locked loop circuit locks and the control voltage VCTRL 425A has reached the nominal operating voltage $V_{NOM}$. Therefore, at time T3 in FIG. 4, the phase locked loop circuit has locked.

For illustration purposes, control voltage VCTRL 425B of FIG. 4 corresponds to the control voltage at the input of the voltage controlled oscillator if a startup circuit was not included in a phase locked loop circuit in accordance with the teaching of the present invention. As shown, control voltage VCTRL 425B begins to rise at a slower rate than control voltage VCTRL 425A beginning at time T1 since an embodiment of a startup circuit of the present invention is not included in the phase locked loop circuit. Consequently, the phase locked loop circuit without an embodiment of the presently described startup circuit does not lock until time T4. As shown, time T4 occurs after time T3, and therefore, a reduced lock acquisition time is provided in accordance with the teachings of the present invention.

Figure 5:
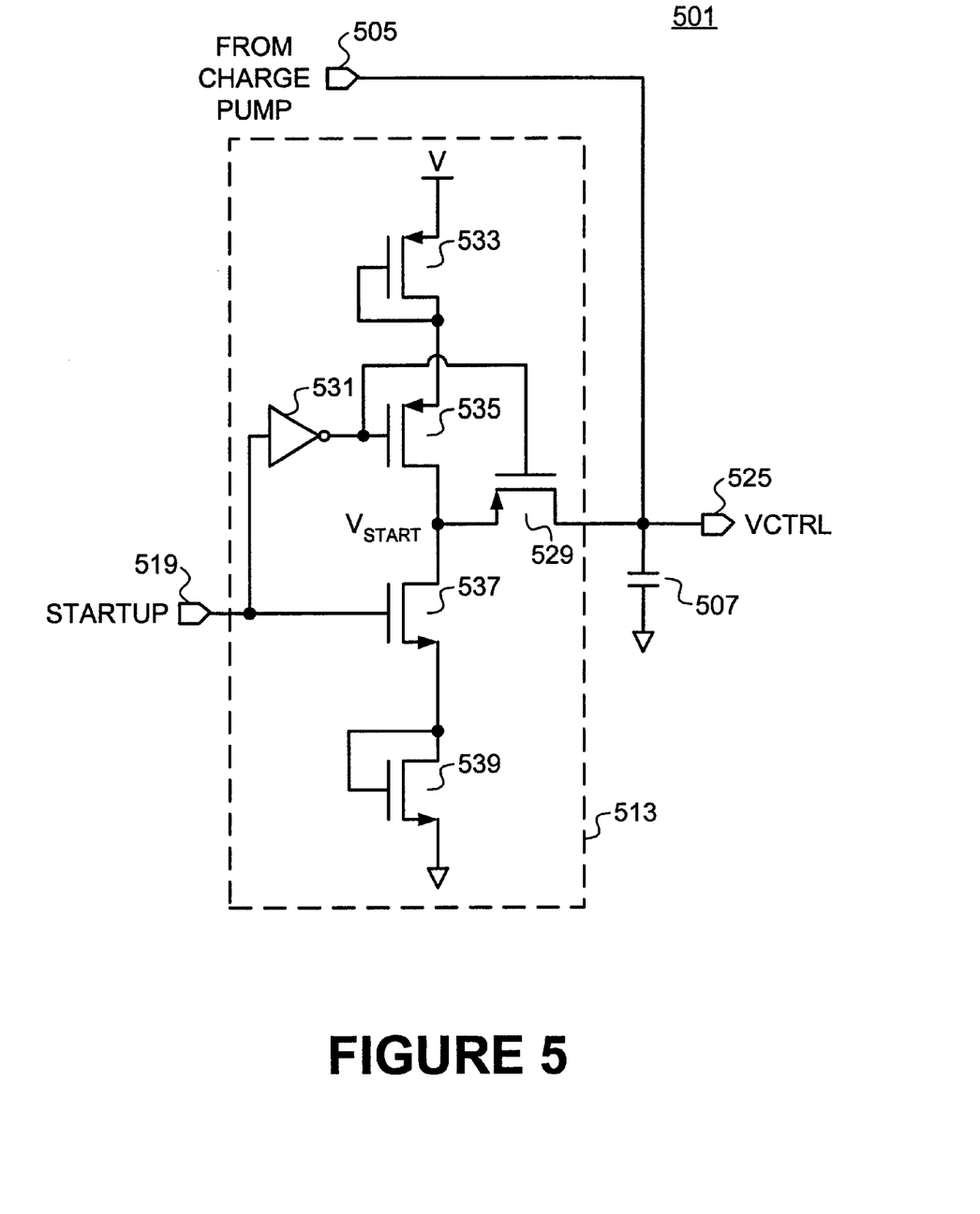
FIG. 5 is a schematic illustrating another embodiment of a startup circuit coupled to a phase locked loop circuit in accordance with the teachings of the present invention.

FIG. 5 is a schematic illustrating another embodiment of a startup circuit 513 in a phase locked loop circuit 501 in accordance with the teachings of the present invention. As shown, a loop filter 507 is coupled to an output of startup circuit 513 as well as an output from charge pump 505 to provide control voltage VCTRL 525 to a voltage controlled oscillator (not shown). In the embodiment shown, startup circuit 513 is digitally responsive to a startup signal 519. When startup signal 519 is active, startup circuit 513 is coupled to provide a voltage $V_{START}$ through transistor 529 to loop filter 507 to supplement charge pump 505 during startup.

In the embodiment illustrated, $V_{START}$ is provided at an intermediate node of a voltage divider circuit. In one embodiment, the voltage divider circuit of startup circuit 513 is provided in between diode connected transistors 533 and 539, which are coupled between a voltage V and ground. In the illustrated embodiment, diode connected transistors 533 and 539 provide resistance, which therefore provide respective voltage drops of the voltage divider. It is appreciated of course that other resistive elements, such as resistors or the like, may be utilized in a voltage divider in accordance with the teachings of the present invention.

As also shown in FIG. 5, one embodiment of startup circuit 513 also includes isolation transistors 535, 537 and 529, which help isolate startup circuit 513 from charge pump 505, loop filter 507 and the voltage controlled oscillator in accordance with the teaching of the present invention. As illustrated, startup signal 519 is coupled to be received by the gate of transistor 537 and is inverted through inverter 531 to be received by the gates of transistors 535 and 529. When startup signal 519 is activated, transistors 535, 537 and 529 are all activated, thereby coupling the voltage $V_{START}$ to loop filter 507. When startup signal 519 is deactivated, transistors 535, 537 and 529 are deactivated, thereby isolating startup circuit 513 from loop filter 507, charge pump 505 and the voltage controlled oscillator.

Figure 6:
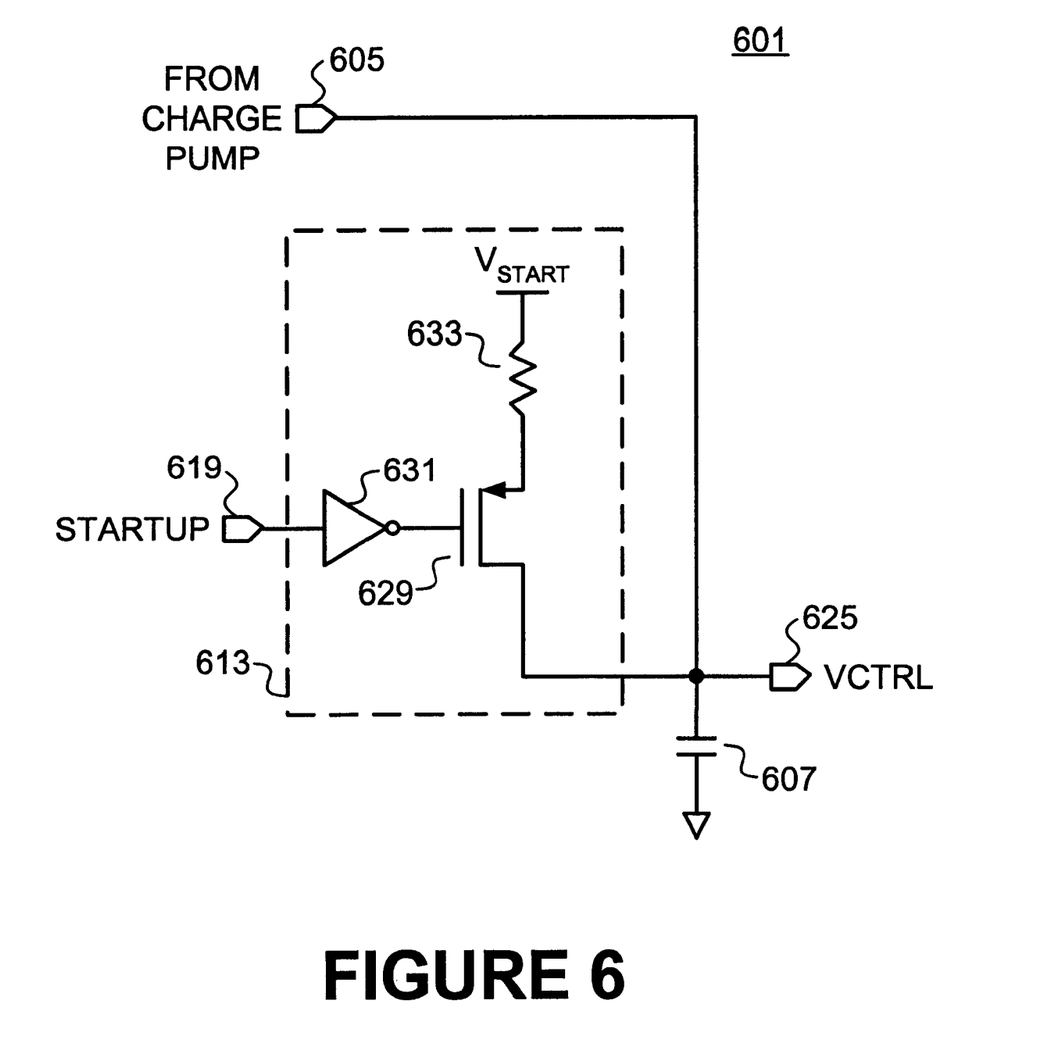
FIG. 6 is a schematic illustrating yet another embodiment of a startup circuit coupled to a phase locked loop circuit in accordance with the teachings of the present invention.

FIG. 6 is a schematic illustrating another embodiment of a startup circuit 613 used with a phase locked loop circuit 601 in accordance with the teachings of the present invention. As illustrated, startup circuit 613 includes a switch that is digitally responsive to startup signal 619 to couple loop filter 607, an output charge pump 605 and an input of the voltage controlled oscillator (not shown) through a pull up resistor to a voltage $V_{START}$. In operation, startup signal 619 is activated at the beginning of startup to switchably couple loop filter 607 through pull up resistor 633 to $V_{START}$ to supplement an output of charge pump 605 during startup. In one embodiment, after the control voltage VCTRL 625 has been charged to a target voltage, startup signal 619 is deactivated, thereby allowing charge pump 605 to maintain the voltage VCTRL 625 in accordance with phase locked loop circuit 601 operations.

In another embodiment, it is appreciated that the polarities of startup circuit 613 may be reversed in accordance with the teachings of the present invention. For instance, it is appreciated that startup circuit 613 could be reconfigured such that loop filter 607 is switchably coupled through a pull down resistor to ground in response to a startup signal 619. Thus, it is appreciated that a voltage controlled oscillator controlled by control voltage VCTRL 625 could begin generating an oscillating signal at a minimum or a maximum frequency in accordance with the teachings of the present invention.

Figure 7:
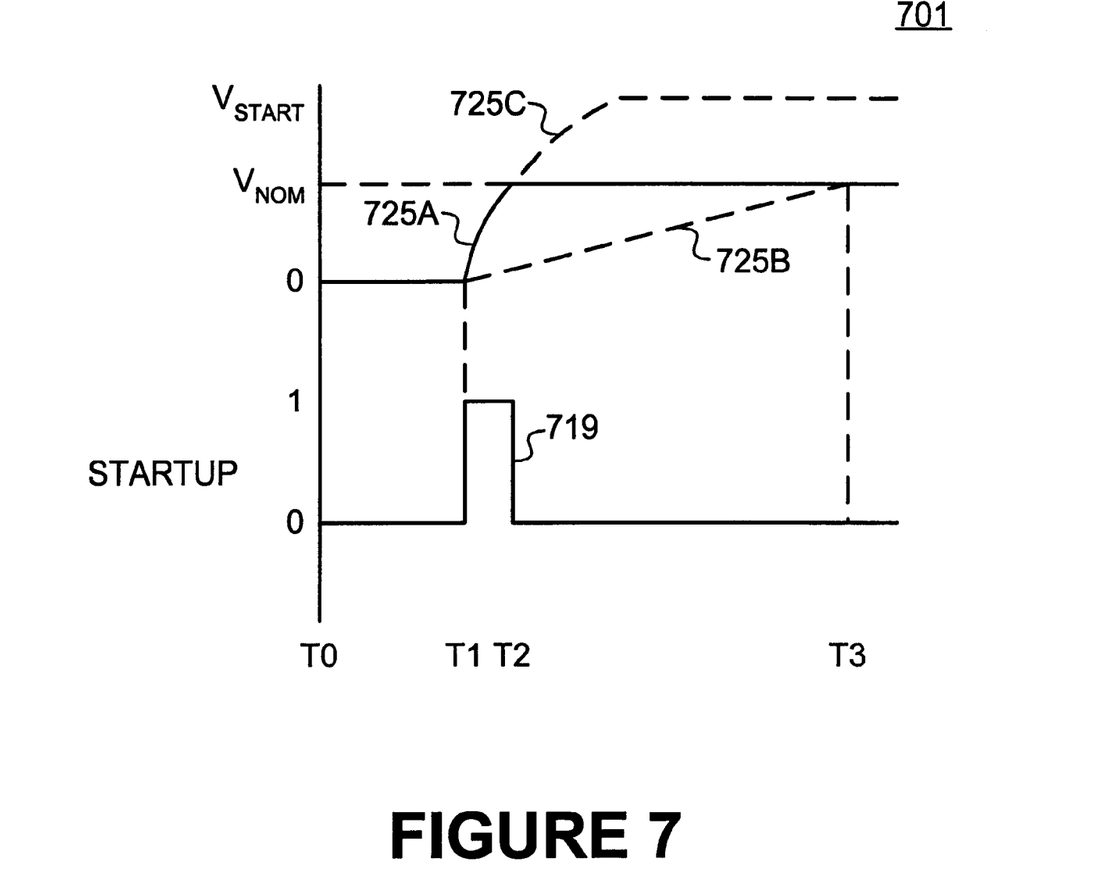
FIG. 7 is a timing diagram illustrating yet another embodiment of a control voltage and a startup signal of a startup circuit in accordance with the teachings of the present invention.

FIG. 7 is yet another embodiment of a timing diagram 701 illustrating various waveforms or voltage levels of a startup circuit used in a phase locked loop circuit in accordance with the teachings of the present invention. In the embodiment illustrated in FIG. 7, the phase locked loop circuit is powered down or is in standby mode at time T0. Accordingly, startup signal 719 is deactivated and the control voltage VCTRL 725A is at zero. At time T1, the phase locked loop circuit is activated and the startup period has begun as the phase locked loop circuit begins to attempt to acquire lock. Accordingly, a startup circuit in accordance with the teachings of the present invention is activated in response to startup signal 719 and control voltage VCTRL 725A begins to asymptotically approach the voltage $V_{START}$ of a startup circuit in accordance with teachings of the present invention.

As illustrated in FIG. 7, $V_{START}$ in the illustrated embodiment is greater than the target nominal operating voltage of the voltage control oscillator. As a result, control voltage VCTRLA 725A is at or near the nominal operating voltage VNOM prior to asymptotically converging with $V_{START}$. As illustrated in FIG.7, startup signal 719 is deactivated at time T2, which corresponds to the time that control voltage VCTRL 725A is at or near nominal operating voltage $V_{NOM}$. At this time, a startup circuit in accordance with the teaching with the present invention is deactivated and the control voltage VCTRL 725A is maintained by the charge pump of the phase locked loop circuit.

For illustration purposes, VCTRL 725C of FIG. 7 illustrates the control voltage that would have been supplied if startup signal 719 was not deactivated at time T2 and the control voltage VCTRL 725C was allowed to continue to asymptotically approach voltage $V_{START}$. Waveform 725B illustrates a phase locked loop circuit not including an embodiment of a startup circuit in accordance with the teachings of the present invention. As shown, the target nominal operating voltage would be reached at time T3, which as shown, would occur after time T2. Accordingly, phase lock acquisition time is reduced with a startup circuit in a phase locked loop circuit in accordance with the teachings of the present invention.

Figure 8:
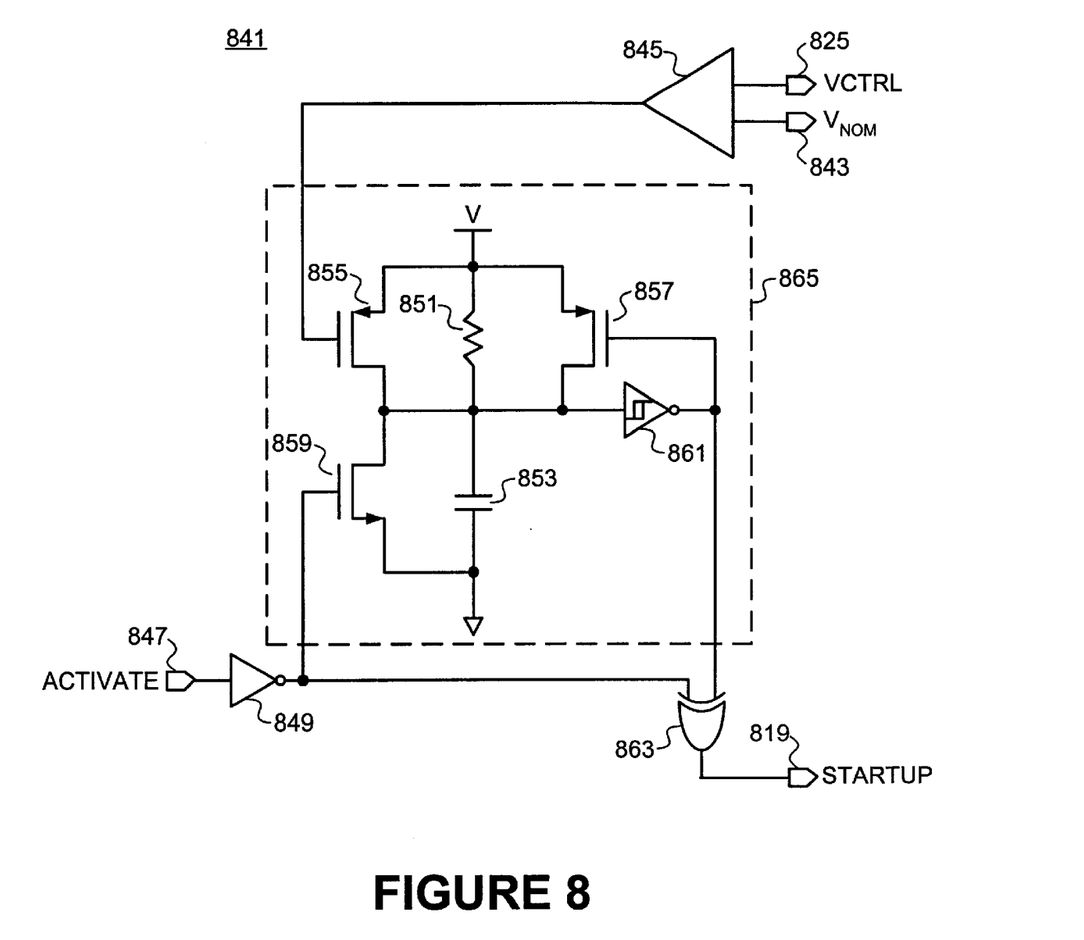
FIG. 8 is a schematic illustrating one embodiment of a startup signal generation circuit coupled to a startup circuit in accordance with the teachings of the present invention.

FIG. 8 is a schematic illustrating one embodiment of a startup signal generation circuit 841, which may be used to provide a startup signal 819 for a startup circuit in accordance with the teachings of the present invention. In one embodiment, startup signal generation circuit 841 includes a comparator 845 having an input coupled to receive the control voltage VCTRL 825 from the input of the voltage controlled oscillator (not shown) of a phase locked loop circuit in accordance with the teachings of the present invention. Another input of comparator 845 is coupled to receive a reference voltage substantially equal to the target nominal operating voltage $V_{NOM}$ of the voltage controlled oscillator after phase lock has been achieved. In operation, comparator 845 compares control voltage VCTRL 825 to the reference voltage substantially equal to the target nominal operating voltage $V_{NOM}$. In one embodiment, comparator 845 is coupled to deactivate startup signal 819 as soon as control voltage VCTRL 825 is at or near nominal operating voltage $V_{NOM}$ 843.

In one embodiment of the present invention, startup signal generation circuit 841 includes a resetable timer circuit 865 or one shot circuit or the like. In one embodiment, timer circuit 865 is coupled to deactivate startup signal 819 after a predetermined time. In one embodiment, the predetermined time is chosen by determining the amount of time that it would take to charge the control input of the voltage controlled oscillator in response to a startup circuit to be at or near the target nominal operating voltage $V_{NOM}$ of the phase locked loop circuit. In one embodiment, the startup circuit is thereby activated for the period of time determined by timer circuit 865 at startup.

In the particular embodiment of startup signal generation circuit 841 illustrated in FIG. 8, both a comparator 845 and a timer circuit 865 are included. As shown, startup signal generation circuit 841 is activated in response to an activate signal 847, which in one embodiment is activated at the beginning of the startup period of the phase locked loop circuit. In operation, the activate signal 847 is received by inverter 849, whose output is coupled to be received by transistor 859 and one input of exclusive-OR gate 863. When the activate signal 847 is activated, the output of inverter 849 is deactivated, which results in the output of the exclusive-OR gate 863, or startup signal 819, being activated.

With the output of inverter 849 inactive in response to activate signal 847, transistor 859 is switched off allowing capacitor 853 to be charged through resistor 851. In one embodiment, an RC circuit including resistor 851 and capacitor 853 is tuned to charge capacitor 853 to switch hysteretic inverter 861 in the predetermined amount of time to allow startup signal 819 to be activated. In particular, after capacitor 853 is adequately charged, the output of hysteretic inverter 861 switches the other input of exclusive-OR gate 863, causing startup signal 819 to be deactivated as well as activating transistor 857.

In the embodiment illustrated, comparator 845 is also coupled to compare control voltage VCTRL 825 with the reference nominal operating voltage $V_{NOM}$ 843. If the control voltage VCTRL 825 is at or near the nominal operating voltage $V_{NOM}$ 843 prior to timer circuit 865 deactivating startup signal 819, the output of comparator 845 is coupled to activate transistor 855 and thereby interrupt the charging of capacitor 853 through resistor 851. In particular, the input of hysteretic inverter 861 as well as capacitor 853 are coupled to voltage V through transistor 855 to quickly charge capacitor 853 and quickly switch the other input of exclusive-OR gate 863 to deactivate startup signal 819.

Therefore, a startup signal 819 used to activate startup circuits described above is generated in accordance with the teachings of the present invention. The presently described startup signal 819 and startup circuits enable phase locked loop circuits to acquire lock in the reduced period of time at startup. Therefore, response time latency to computer operations immediately following startup are not as noticeable when compared to present day phase locked loop circuits without startup circuitry in accordance with the teachings of the present invention. The present invention reduces phase locked loop acquisition time by forcing the phase locked loop circuit to start at or near it target frequency of operation.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An apparatus, comprising:
   a charge pump having a charge pump output;
   an oscillator having a control input coupled to the charge pump output to generate an oscillating signal responsive to the charge pump output;
   a startup circuit coupled to the charge pump output to supplement the charge pump output during a startup period of the apparatus in responsive to a startup signal; and
   a startup signal generation circuit coupled to the startup circuit to generate the startup signal during the startup period of the apparatus, the startup signal generation circuit coupled to receive an activate signal to indicate a beginning of the startup period of the apparatus, the startup signal generation circuit including a timer circuit coupled to receive the activate signal, the startup signal responsive to an output of the timer circuit.

2. The apparatus of claim 1 further comprising a loop filter coupled to the charge pump output, the oscillator coupled to the loop filter to receive a control voltage responsive to the charge pump output and the startup circuit, the oscillating signal responsive to the control voltage.

3. The apparatus of claim 2 wherein the loop filter comprises a capacitor.

4. The apparatus of claim 1 further comprising a phase detector coupled to the charge pump and coupled to receive a reference signal and the oscillating signal, the phase detector to control the charge pump in response to the reference signal and the oscillating signal.

5. The apparatus of claim 1 wherein the startup circuit comprises a switch coupled between a voltage source and the charge pump output, the switch to couple the voltage source to the control input of the oscillator in response to the startup signal.

6. The apparatus of claim 5 wherein the voltage source comprises a voltage divider.

7. The apparatus of claim 5 wherein the voltage source comprises a resistor coupled to a power supply rail.

8. The apparatus of claim 5 wherein the voltage source is coupled to provide a voltage substantially equal to a nominal operating voltage to be received by the control input of the oscillator after the startup period of the apparatus.

9. The apparatus of claim 5 wherein the voltage source is coupled to provide a voltage greater than a nominal operating voltage to be received by the control input of the oscillator after the startup period of the apparatus.

10. The apparatus of claim 5 wherein the voltage source is coupled to provide a voltage less than a nominal operating voltage to be received by the control input of the oscillator after the startup period of the apparatus.

11. The apparatus of claim 1 wherein the startup signal generation circuit comprises a comparator coupled to receive a comparison voltage and a control voltage coupled to be received by the control input of the oscillator, the startup signal responsive to an output of the comparator.

12. A method, comprising:
    generating a control voltage with a charge pump;
    pulling the control voltage towards a start voltage with a startup circuit in response to a startup signal during a startup period;
    generating the startup signal during the startup period when an activate signal indicates a beginning of the startup period;
    deactivating the startup signal in response to a timer circuit; and
    generating an oscillating signal with a oscillator circuit responsive to the control voltage.

13. The method of claim 12 wherein the start voltage is substantially equal to a nominal operating voltage for the control voltage after the startup period.

14. The method of claim 12 wherein the start voltage is greater than a nominal operating voltage for the control voltage after the startup period.

15. The method of claim 12 wherein the start voltage is less than a nominal operating voltage for the control voltage after the startup period.

16. The method of claim 12 wherein pulling the control voltage towards the start voltage with the startup circuit comprises activating a start voltage source in response to the startup signal during the startup period.

17. The method of claim 15 wherein deactivating the start voltage source comprises comparing the control voltage with a nominal operating voltage for the control voltage.

18. The method of claim 15 wherein deactivating the start voltage source comprises deactivating the start voltage source after a time period.

19. The method of claim 12 further comprising filtering the control voltage with a loop filter circuit.

20. The method of claim 12 further comprising:
measuring a phase difference between the oscillating signal and a reference signal; and
maintaining the control voltage with the charge pump in response to the phase difference between the oscillating signal and a reference signal.

* * * * *